(12) United States Patent
Zheng (10) Patent No.: US 12,550,504 B2
(45) Date of Patent: Feb. 10, 2026

(54) LED DISPLAY PANEL AND MANUFACTURING METHOD THEREOF

(71) Applicant: TCL CHINA STAR OPTOELECTRONICS TECHNOLOGY CO., LTD., Guangdong (CN)

(72) Inventor: Zeke Zheng, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 789 days.

(21) Appl. No.: 17/758,134

(22) PCT Filed: May 31, 2022

(86) PCT No.: PCT/CN2022/096439
§ 371 (c)(1),
(2) Date: Jun. 29, 2022

(87) PCT Pub. No.: WO2023/221178
PCT Pub. Date: Nov. 23, 2023

(65) Prior Publication Data
US 2024/0194841 A1  Jun. 13, 2024

(30) Foreign Application Priority Data
May 19, 2022 (CN) .......................... 202210557490.X (51) Int. Cl.
*H10H 20/857* (2025.01)
*H01L 25/075* (2006.01)
*H10H 20/01* (2025.01)

(52) U.S. Cl.
CPC ....... *H10H 20/857* (2025.01); *H01L 25/0753* (2013.01); *H10H 20/0364* (2025.01)

(58) Field of Classification Search
CPC .. H10H 20/857; H10H 20/0364; H10H 20/85; H10H 20/036; H01L 25/0753
See application file for complete search history.

(56) References Cited

U.S. PATENT DOCUMENTS

| 11,050,969 B2 * | 6/2021 | Lu .......................... H05K 3/361 |
| 2019/0148611 A1 * | 5/2019 | He ......................... H10H 20/83 257/72 |

(Continued)

FOREIGN PATENT DOCUMENTS

| CN | 109148506 A | 1/2019 |
| CN | 112838079 A | 5/2021 |

(Continued)

OTHER PUBLICATIONS

International Search Report in International application No. PCT/CN2022/096439, mailed on Nov. 25, 2022.

(Continued)

*Primary Examiner* — Moazzam Hossain
(74) *Attorney, Agent, or Firm* — PV IP PC; Wei Te Chung (57) ABSTRACT

A light-emitting diode (LED) display panel and a manufacturing method thereof are provided. The LED display panel includes a substrate, an LED array, and conductive members. The LED array includes a plurality of LED chips disposed on the substrate in an array. The conductive members are disposed between the LED chips and the substrate. The LED chips are fixed onto and electrically connected to the substrate by the conductive members, and the conductive members have adhesion, and the adhesion is adjustable.

9 Claims, 3 Drawing Sheets

(56) References Cited

U.S. PATENT DOCUMENTS

| | | | | |
|---|---|---|---|---|
| 2019/0293242 A1* | 9/2019 | Park | .................. | H10H 20/8513 |
| 2021/0384051 A1* | 12/2021 | Katz | ................. | H01L 21/67132 |
| 2024/0297284 A1* | 9/2024 | Hong | ................... | H10H 20/853 |

FOREIGN PATENT DOCUMENTS

| | | | | | |
|---|---|---|---|---|---|
| CN | 112993134 A | * | 6/2021 | ........... | H10H 20/857 |
| CN | 113054073 A | * | 6/2021 | ........... | H10H 20/857 |
| CN | 113450681 A | * | 9/2021 | ............. | G09G 3/006 |
| CN | 113555473 A | | 10/2021 | | |

OTHER PUBLICATIONS

Written Opinion of the International Search Authority in International application No. PCT/CN2022/096439, mailed on Nov. 25, 2022.

Chinese Office Action issued in corresponding Chinese Patent Application No. 202210557490.X dated Nov. 9, 2024, pp. 1-13.

* cited by examiner

LED DISPLAY PANEL AND MANUFACTURING METHOD THEREOF

FIELD OF INVENTION

The present disclosure relates to the field of display technologies, and more particularly, to an LED display panel and a manufacturing method thereof.

BACKGROUND OF INVENTION

In manufacture of light-emitting diode (LED) display panels, after a huge number of LED chips are transferred to a target substrate, it is usually necessary to detect and repair bad lights to ensure that all pixels on the panels emit light normally.

However, when the LED chips are detected for the bad lights, since the LED chips have been fixedly connected to circuits on the target substrate, if a bad light is detected, a connection structure between a bad LED chip and the target substrate needs to be disassembled, and after replacing or repairing the bad LED chip, it is necessary to re-fix the LED chip to the target substrate, which are cumbersome. As a result, the detection and repairing efficiency of the display panels is low.

Technical problem: current LED display panels have problems of cumbersome detection and repairing of LED chips, resulting in low efficiency.

SUMMARY OF INVENTION

An embodiment of the present disclosure provides an LED display panel, which includes:
  a substrate;
  an LED array including a plurality of LED chips disposed on the substrate in an array; and
  a plurality of conductive members disposed between the LED chips and the substrate, wherein, the LED chips are fixed onto and electrically connected to the substrate by the conductive members, the conductive members include a photocuring conductive adhesive, and the photocuring conductive adhesive is changed from a liquid state to a solid state under a visible light condition;
  wherein, the conductive members have adhesion, and the adhesion is adjustable.

An embodiment of the present disclosure further provides an LED display panel, which includes:
  a substrate;
  an LED array including a plurality of LED chips disposed on the substrate in an array; and
  a plurality of conductive members disposed between the LED chips and the substrate, wherein, the LED chips are fixed onto and electrically connected to the substrate by the conductive members;
  wherein, the conductive members have adhesion, and the adhesion is adjustable.

An embodiment of the present disclosure further provides a manufacturing method of an LED display panel. The method includes following steps:
  providing a substrate and a plurality of LED chips;
  disposing conductive members having adjustable adhesion on the substrate or the LED chips;
  transferring the LED chips onto the substrate and electrically connecting the LED chips to the substrate by the conductive members; and
  powering the LED chips and adjusting adhesion of corresponding conductive members according to a light-emitting state of the LED chips.

An embodiment of the present disclosure further provides a manufacturing method of an LED display panel. The method includes following steps:
  providing a substrate and a plurality of LED chips;
  disposing conductive members having adjustable adhesion on the substrate or the LED chips;
  transferring the LED chips onto the substrate and electrically connecting the LED chips to the substrate by the conductive members; and
  powering the LED chips and adjusting adhesion of corresponding conductive members according to a light-emitting state of the LED chips.

Beneficial effect: in the present disclosure, by disposing the conductive members having adhesion between the LED chips and the substrate and allowing the adhesion of the conductive members to be adjustable, the conductive members can have lower adhesion before testing the LED chips, while after testing the LED chips, adhesion of the conductive members corresponding to the LED chips having normal light emission is enhanced for fixation, and adhesion of the conductive members corresponding to the LED chips having abnormal light emission is unchanged or even reduced at a same time. Therefore, the LED chips having abnormal light emission can be replaced or repaired directly on the substrate, and after replacing or repairing, the adhesion of the conductive members corresponding to the LED chips originally having abnormal light emission can be enhanced for fixation. Finally, high efficiency of LED detection and repair can be realized, thereby effectively improving the efficiency of LED detection and repair.

DESCRIPTION OF DRAWINGS

The accompanying figures to be used in the description of embodiments of the present disclosure will be described in brief to more clearly illustrate the technical solutions of the embodiments. The accompanying figures described below are only part of the embodiments of the present disclosure, from which those skilled in the art can derive further figures without making any inventive efforts.

Elements in the drawings are designated by reference numerals listed below.

substrate: 100; LED chip: 200; light-emitting part: 210; electrode part: 220; first transparent electrode: 221; second transparent electrode: 222; insulating part: 230; conductive member: 300; first conductive part: 310; second conductive part: 320; positioning groove: 400; barrier member: 500; and light-shielding wall: 600.

DETAILED DESCRIPTION OF PREFERRED EMBODIMENTS

The technical solutions in the embodiments of the present disclosure will be clearly and completely described below with reference to the drawings in the embodiments of the present disclosure. Obviously, the described embodiments are only a part of the embodiments of the present disclosure, but not all the embodiments. Based on the embodiments in the present disclosure, all other embodiments obtained by those skilled in the art without creative efforts are within the scope of the present disclosure. In addition, it should be understood that the specific embodiments described herein are only used to illustrate and explain the present disclosure and are not used to limit the present disclosure. In the present disclosure, in the case of no explanation to the contrary, the orientation words used such as "on" and "under" usually refer to upper and lower directions of the device in actual use or working state, and specifically the directions in the drawings; and "inside" and "outside" refers to the outline of the device.

In manufacture of light-emitting diode (LED) display panels, after a huge number of LED chips are transferred to a target substrate, it is usually necessary to detect and repair bad lights to ensure that all pixels on the panels emit light normally.

However, when the LED chips are detected for the bad lights, since the LED chips have been fixedly connected to circuits on the target substrate, if a bad light is detected, a connection structure between a bad LED chip and the target substrate needs to be disassembled, and after replacing or repairing the bad LED chip, it is necessary to re-fix the LED chip to the target substrate, which are cumbersome. As a result, the detection and repairing efficiency of the display panels is low. In view of forgoing technical problems, the present disclosure provides following solutions.

Referring to FIGS. 1 to 6, the present disclosure provides a light-emitting diode (LED) display panel, which includes a substrate 100, an LED array, and conductive members 300. The LED array includes a plurality of LED chips 200 disposed on the substrate 100 in an array. The conductive members 300 are disposed between the LED chips 200 and the substrate 100, and the LED chips 200 are fixed onto and electrically connected to the substrate 100 by the conductive members 300. The conductive members 300 have adhesion, and the adhesion is adjustable.

In the present disclosure, by disposing the conductive members 300 having adhesion between the LED chips 200 and the substrate 100 and allowing the adhesion of the conductive members 300 to be adjustable, the conductive members 300 can have lower adhesion before testing the LED chips 200, while after testing the LED chips 200, adhesion of the conductive members 300 corresponding to the LED chips 200 having normal light emission is enhanced for fixation, and adhesion of the conductive members 300 corresponding to the LED chips 200 having abnormal light emission is unchanged or even reduced at a same time. Therefore, the LED chips 200 having abnormal light emission can be replaced or repaired directly on the substrate 100, and after replacing or repairing, the adhesion of the conductive members 300 corresponding to the LED chips 200 originally having abnormal light emission can be enhanced for fixation. Finally, high efficiency of LED detection and repair can be realized, thereby effectively improving the efficiency of LED detection and repair.

Specific embodiments are used to describe technical solutions of the present disclosure. It should be noted that an order of description in the following embodiments is not meant to limit a preferred order of the embodiments.

In this embodiment, the substrate 100 may be a transparent glass substrate 100 or a polyimide substrate 100.

In this embodiment, the LED chips 200 may be ordinary LEDs, mini-LEDs, or micro-LEDs.

In this embodiment, the conductive members 300 may be photosensitive adhesives, thermal-sensitive adhesives, pressure-sensitive adhesives, or water-soluble adhesives, that are doped with conductive particles.

It should be noted that the adhesion of the conductive members 300 being adjustable may include two situations. The first situation is that the adhesion of the conductive members 300 is reversibly adjusted. That is, the adhesion of the conductive members 300 can be adjusted from low adhesion to high adhesion, and can also be adjusted from high adhesion to low adhesion, such as hot glue, hydrogels made of polyhydroxyethyl methacrylate polymers having a principle similar to "snail slime", acrylic hydrogels, etc. The second situation is that the adhesion of the conductive members 300 is irreversibly adjusted. That is, the adhesion of the conductive members 300 can be adjusted from low adhesion to high adhesion until it is cured from a viscous liquid state to a solid state. At this time, the adhesion of the conductive members 300 can no longer be adjusted to low adhesion, so it cannot be restored to a low adhesion liquid state, such as UV-curing adhesives, pressure-sensitive adhesives, etc.

Figure 1:
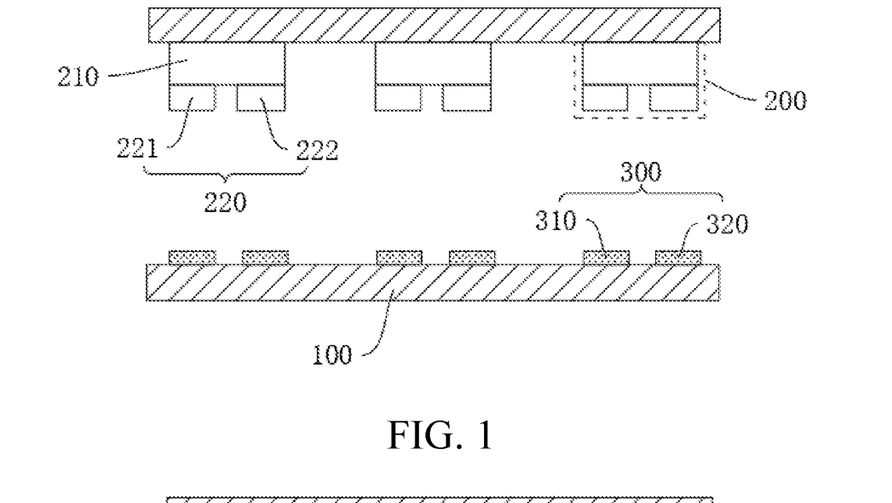
FIG. 1 is a schematic structural diagram of a display panel before transferring LED chips onto a substrate.
Figure 2:
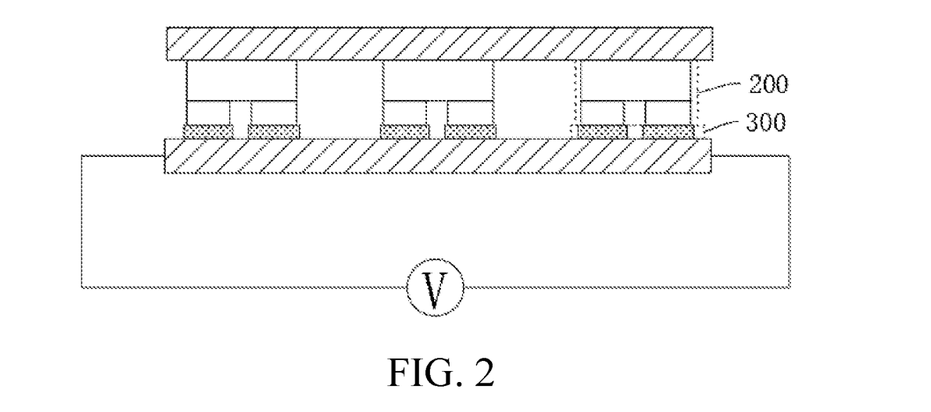
FIG. 2 is a first schematic structural diagram of the display panel according to an embodiment of the present disclosure.

Referring to FIGS. 1 and 2, in the LED display panel of the present disclosure, the conductive members 300 include a photocuring conductive adhesive, and the photocuring conductive adhesive can be changed from a liquid state to a solid state under a visible light condition. At this time, the photocuring conductive adhesive is a photosensitive adhesive having irreversibly adjustable adhesion mentioned above. The photocuring conductive adhesive can be automatically cured into the solid state under irradiation of visible light, thereby fixing the LED chips 200 onto the substrate 100.

In this embodiment, by setting the conductive members 300 as the photocuring conductive adhesive, after transferring the LED chips 200 onto the substrate 100 and finishing the test on the LED chips 200, using the visible light to irradiate the conductive members 300 (that is, the photocuring conductive adhesive) corresponding to the LED chips 200 having normal light emission can allow the photocuring conductive adhesive to be cured, thereby fixing the LED chips 200 having normal light emission onto the substrate 100. The LED chips 200 having abnormal light emission are shaded to maintain their corresponding conductive members 300 (that is, the photocuring conductive adhesive) in a viscous liquid state which has lower adhesion. At this time, the abnormal LED chips 200 are not fixed onto the substrate 100, so the abnormal LED chips 200 can be directly repaired or removed from the substrate 100, or the abnormal LED chips 200 can be directly attached to a transfer device and taken away. Therefore, the LED chips 200 having abnormal light emission can be repaired and replaced more quickly and conveniently, thereby improving the repair efficiency.

Referring to FIG. 1, in the LED display panel of the present disclosure, each of the LED chips 200 may include a light-emitting part 210 and an electrode part 220 electrically connected to the light-emitting part 210. The light-emitting part 210 may be disposed on one side of the LED chips 200 away from the substrate 100, that is, the light-emitting part 210 may be disposed adjacent to the light-emitting side of the display panel. The electrode part 220 may be disposed between the LED chips 200 and the substrate 100, thereby realizing the electrical connection between the LED chips 200 and the substrate 100.

In this embodiment, the light-emitting part 210 may be a semiconductor light-emitting part of the LED chips 200, and the electrode part 220 may be a chip electrode electrically connected to the semiconductor light-emitting part. The electrode part 220 includes at least one transparent electrode, and the at least one transparent electrode is connected to the conductive members 300.

In this embodiment, the transparent electrode may be prepared by a transparent conductive film material, such as indium tin oxide (ITO).

Figure 3:
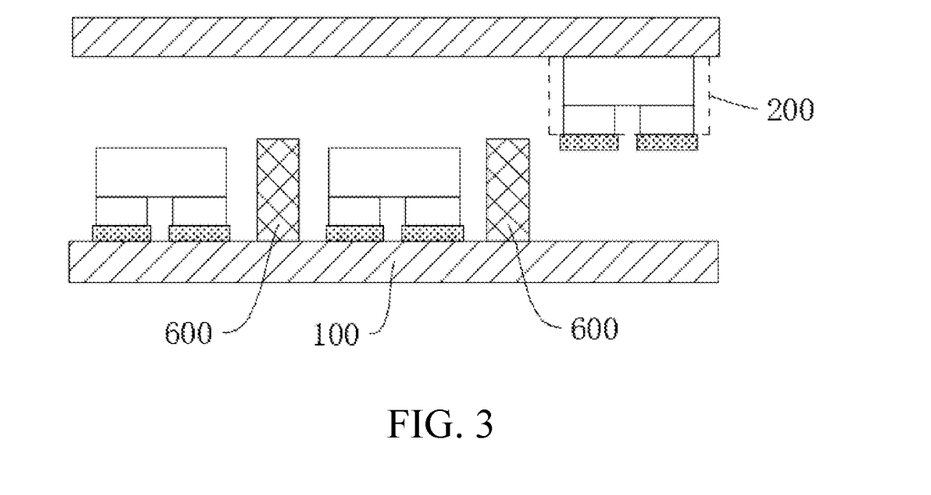
FIG. 3 is a schematic structural diagram of the display panel after a test stage according to an embodiment of the present disclosure.

As shown in FIGS. 2 and 3, in this embodiment, when the substrate 100 is powered to test the LED chips 200, light emitted from normal LED chips 200 can pass through the at least one transparent electrode and irradiate on the conductive members 300 having photocuring conductive adhesive material to directly cure the conductive members 300, thereby fixing the LED chips 200 onto the substrate 100. Abnormal LED chips 200 do not emit light, so the conductive members 300 corresponding to the abnormal LED chips 200 remain in the viscous liquid state having low adhesion since they are not irradiated by the visible light, thereby facilitating to directly replacing or repairing the abnormal LED chips 200. By the above settings, in the display panel of this embodiment, the normal LED chips 200 can be fixed onto the substrate 100 in the testing stage of the LED chips 200 without affecting quick repair and replacement of abnormal chips, thereby further improving the detection and repairing efficiency of the LED chips 200.

It should be noted that in order to prevent or reduce the adverse effects of the light emitted by the LED chips 200 having normal emission on the conductive members 300 corresponding to the abnormal LED chips 200, in this embodiment, a light-shielding wall 600 may be disposed between two adjacent LED chips 200, and the light-shielding wall 600 may be disposed on the substrate 100. Light-shielding walls 600 on the periphery of each of the LED chips 200 may be continuously arranged to form a closed rectangular frame that encloses the LED chips 200 therein.

In this embodiment, a distance from a side surface of the light-shielding wall 600 away from the substrate 100 to the substrate 100 is greater than or equal to a distance from a side surface of the LED chips 200 away from the substrate 100 to the substrate 100. In other words, in the light-emitting direction of the display panel, based on one side of the substrate 100 adjacent to the LED chips 200, a height of the light-shielding wall 600 on the substrate 100 may be greater than or equal to a height of the LED chips 200 on the substrate 100, so that the light-shielding wall 600 can sufficiently block light emitted from side surfaces of the LED chips 200.

In this embodiment, by disposing light-shielding walls 600, the light-shielding walls 600 can block light emitted from side surfaces of each of the LED chips 200. Therefore, in the testing stage, the situation of the light emitted by the LED chips 200 having normal light emission irradiating on the conductive members 300 corresponding to the abnormal LED chips 200 and causing them to be cured can be prevented or reduced, thereby improving production yield of the display panel.

Referring to FIG. 1, in the display panel of the present disclosure, the substrate 100 may include electrode connection parts (not shown in the figures) electrically connected to the electrode part 220 of the LED chips 200, and each of the electrode connection parts may include a positive electrode connection part and a negative electrode connection part. The positive electrode connection part and the negative electrode connection part are electrically connected to a pixel driving circuit on the substrate 100, and when the substrate 100 is in a powered state, there is a working voltage on the electrode connection parts to drive the LED chips 200 to emit light.

In this embodiment, the electrode part 220 corresponding to one LED chip 200 may include two insulating transparent electrodes, and the two transparent electrodes constitute a positive electrode and a negative electrode of the LED chip 200, respectively. Specifically, the electrode part 220 of the LED chip 200 may include a first transparent electrode 221 and a second transparent electrode 222, and the first transparent electrode 221 and the second transparent electrode 222 may serve as the positive electrode and the negative electrode of the LED chip 200, respectively.

In this embodiment, corresponding to the transparent electrodes, a number of the conductive members 300 is same as that of the transparent electrodes. Specifically, each of the conductive members 300 may include a first conductive part 310 electrically connected to the first transparent electrode 221 and a second conductive part 320 electrically connected to the second transparent electrode 222. When the LED chips 200 are transferred to the substrate 100, the first transparent electrode 221 needs to correspond to a position of the positive electrode connection part, and the second transparent electrode 222 needs to correspond to a position of the negative electrode connection part. The first conductive part 310 needs to be insulated from the second conductive part 320 to prevent a short circuit problem between the positive electrode and the negative electrode of the LED chips 200 due to the first conductive part 310 and the second conductive part 320.

In this embodiment, the conductive members 300 may be disposed on the electrode connection parts, and an orthographic projection of the electrode connection parts on the conductive members 300 may be located in the conductive members 300, so that the conductive members 300 can completely cover the electrode connection parts. Therefore, the electrode part 220 of the LED chips 200 can be sufficiently attached to the substrate 100, thereby improving the adhesion strength between the LED chips 200 and the substrate 100.

Referring to FIG. 1, in the display panel of the present disclosure, the first conductive part 310 and the second conductive part 320 may be arranged separately to be insulated from each other. In a first direction, a spacing between the first conductive part 310 and the second conductive part 320 is less than or equal to a spacing between the first transparent electrode 221 and the second transparent electrode 222. Wherein, the first direction is parallel to a connecting direction of the first transparent electrode 221 and the second transparent electrode 222.

In this embodiment, by the above settings, the orthographic projection of the first transparent electrode 221 on the first conductive part 310 may be completely located in the first conductive part 310, and the orthographic projection of the second transparent electrode 222 on the second conductive part 320 may be completely located in the second conductive part 320, so the first conductive part 310 can fully adhere and fix the first transparent electrode 221, and the second conductive part 320 can fully adhere and fix the second transparent electrode 222.

Figure 4:
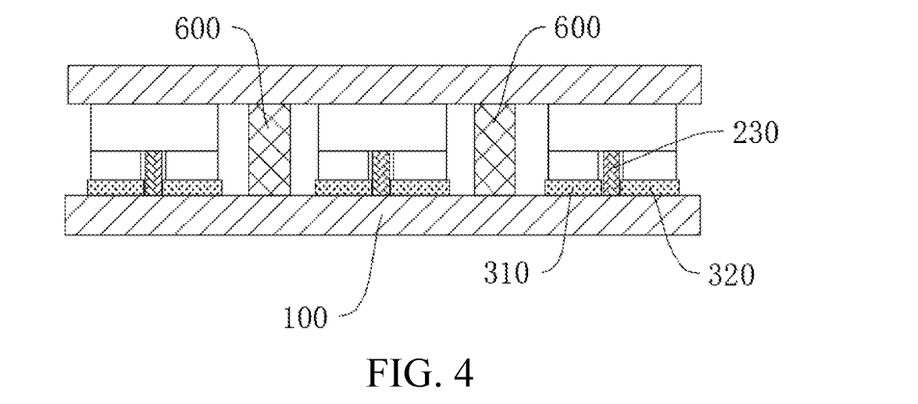
FIG. 4 is a second schematic structural diagram of the display panel according to an embodiment of the present disclosure.

Referring to FIG. 4, in the display panel of the present disclosure, each of the LED chips 200 may further includes an insulating part 230 disposed between the first transparent electrode 221 and the second transparent electrode 222. The insulating part 230 may be made of insulating materials, such as inorganic insulating materials such as SiOx and SiNx, or the insulating part 230 may also be made of organic insulating materials, which are not specifically limited in this embodiment.

In this embodiment, in the light-emitting direction of the LED display panel, a thickness of the insulating part 230 may be equal to a sum of a thickness of the first transparent electrode 221 or the second transparent electrode 222 and a thickness of the conductive members 300. At this time, after the LED chips 200 are transferred to the substrate 100, the insulating part 230 can not only realize the insulating arrangement between the first transparent electrode 221 and the second transparent electrode 222, but also realize the insulating arrangement between the first conductive part 310 and the second conductive part 320. Therefore, the stability of electrical connection structures between the LED chips 200 and the substrate 100 can be sufficiently improved, thereby reducing circuit failures, such as short circuits.

Referring to FIG. 2, in the display panel of the present disclosure, the conductive members 300 may be disposed on the transparent electrodes of the LED chips, and an orthographic projection of the transparent electrodes on the conductive members 300 is located in the conductive members 300. Therefore, the conductive members 300 can be allowed to fully cover the transparent electrodes, thereby improving the connecting strength between the transparent electrodes and the electrode connection parts on the substrate 100.

In this embodiment, before the LED chips 200 are transferred to the substrate 100, the conductive members 300 can be formed by coating or spraying the photocuring conductive adhesive on the transparent electrodes of the LED chips 200 first, so that the alignment process or steps required when disposing the conductive members 300 on the substrate 100 can be omitted. Therefore, the production efficiency of the LED display panel and the alignment accuracy of the LED chips 200, the conductive members 300, and the substrate 100 can be effectively improved.

Figure 5:
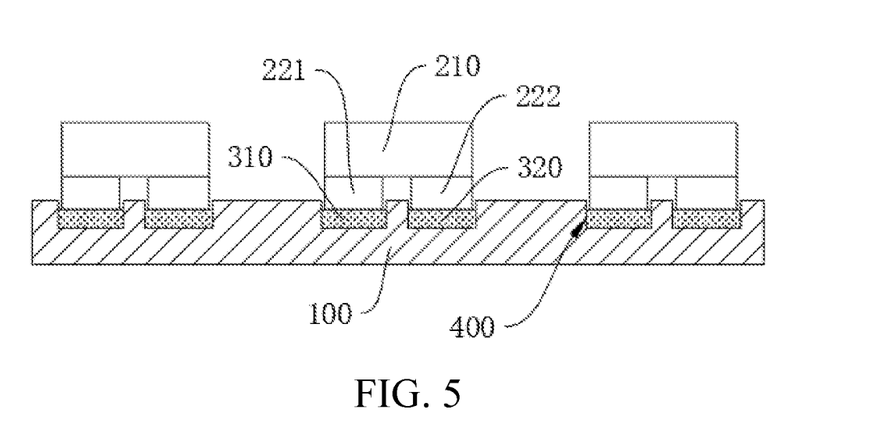
FIG. 5 is a third schematic structural diagram of the display panel according to an embodiment of the present disclosure.

Referring to FIG. 5, in the display panel of the present disclosure, the substrate 100 may be provided with a plurality of positioning grooves 400 disposed in an array, and the conductive members 300 are located in the positioning grooves 400. The positioning grooves 400 can limit the position of the conductive members 300, thereby reducing the position deviation of the conductive members 300 and the LED chips 200 on the substrate 100 and improving the transfer accuracy and yield.

In this embodiment, in the light-emitting direction of the LED display panel, a depth of the positioning grooves 400 may be equal to a thickness of the conductive members 300, and the depth of the positioning grooves 400 may be less than or equal to a sum of thicknesses of the conductive members 300 and the transparent electrodes. At this time, the positioning grooves 400 can have a better anti-overflow effect, reducing the overflow of the conductive members 300 when the conductive members 300 are in a mucus state. Therefore, the problem of short circuits between the first conductive part 310 and the second conductive part 320 due to the overflow of the conductive members 300 can be prevented.

In this embodiment, in the light-emitting direction of the LED display panel, the depth of the positioning grooves 400 may also be greater than the thickness of the conductive members 300, and the depth of the positioning grooves 400 may be less than or equal to the sum of the thicknesses of the conductive members 300 and the transparent electrodes. That is, the LED chips 200 may be partially located in the positioning grooves 400. At this time, the positioning grooves 400 can not only prevent the conductive members 300 from overflowing, but also have the effect of positioning the LED chips 200 and preventing the position deviation of the LED chips 200.

Figure 6:
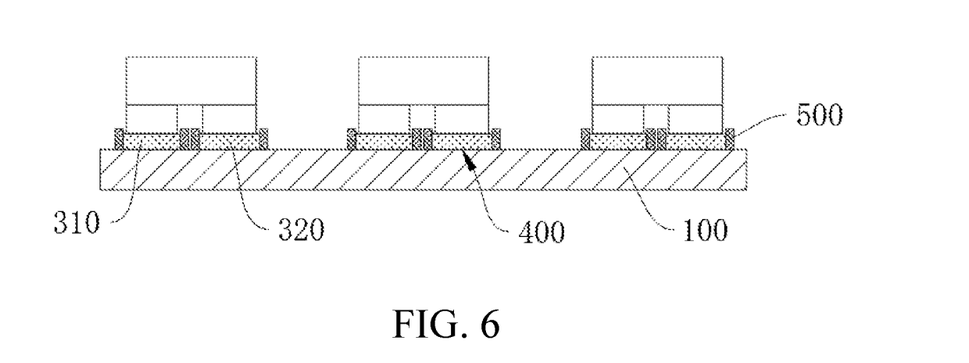
FIG. 6 is a fourth schematic structural diagram of the display panel according to an embodiment of the present disclosure.

Referring to FIG. 6, in the LED display panel of the present disclosure, the substrate 100 may be provided with a plurality of barrier members 500 disposed in an array, and the barrier members 500 are defined with positioning grooves 400 corresponding to the LED chips 200. The shape and size of the positioning grooves 400 may be consistent with the shape and size of the LED chips 200.

In this embodiment, the conductive members 300 may be disposed in the positioning grooves 400 of the barrier members 500, in the light-emitting direction of the LED display panel, a depth of the positioning grooves 400 may be greater than or equal to the thickness of the conductive members 300, and the depth of the positioning grooves 400 may be less than or equal to the sum of thicknesses of the conductive members 300 and the transparent electrodes. Therefore, the barrier members 500 can form retaining walls around the periphery of the conductive members 300 to prevent the conductive members 300 from overflowing. Further, the LED chips 200 may also be partially located in the positioning grooves 400 of the barrier members 500, so that the barrier members 500 can use the positioning grooves 400 to play a good role in positioning and limiting the LED chips 200, thereby improving the positional stability of the LED chips 200 on the substrate 100.

Figure 7:
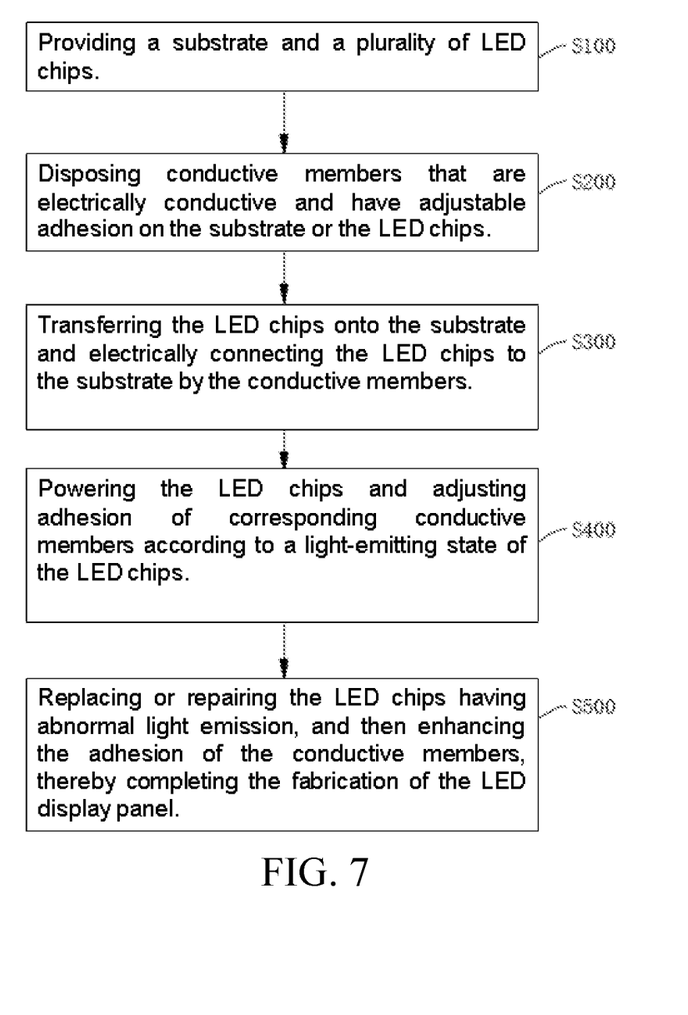
FIG. 7 is a flowchart of a manufacturing method of the display panel according to an embodiment of the present disclosure.

Referring to FIG. 7, an embodiment of the present disclosure further provides a manufacturing method of an LED display panel for manufacturing the display panel in the above embodiments. The manufacturing method of the LED display panel includes following steps.

S100: providing a substrate 100 and a plurality of LED chips 200.

S200: disposing conductive members 300 that are electrically conductive and have adjustable adhesion on the substrate 100 or the LED chips 200.

In this embodiment, the conductive members 300 may be the photocuring conductive adhesive, and preferably, the photocuring conductive adhesive may be cured automatically under the irradiation of the visible light, that is, the photocuring conductive adhesive may be cured from a liquid state having lower adhesion to a solid state having higher adhesion.

S300: transferring the LED chips 200 onto the substrate 100 and electrically connecting the LED chips 200 to the substrate 100 by the conductive members 300.

In this embodiment, specifically, the transparent electrodes of the LED chips 200 can be electrically connected to the substrate 100 by the conductive members 300.

S400: powering the LED chips 200 and adjusting adhesion of corresponding conductive members 300 according to a light-emitting state of the LED chips 200.

In this embodiment, the power-on detection of the LED chips 200 can be realized by powering the substrate 100. By adjusting the adhesion of the conductive members 300 corresponding to the LED chips 200, the adhesion of the conductive members 300 corresponding to the LED chips 200 having normal light emission can be enhanced, and the adhesion of the conductive members 300 corresponding to the LED chips 200 having abnormal light emission can remain unchanged or be reduced.

In this embodiment, adjusting the adhesion of the conductive members 300 corresponding to the LED chips 200 can be realized by whether the LED chips 200 emit light or not. Specifically, when the substrate 100 is powered, qualified LED chips 200 emit light normally after power-on, and the visible light emitted from them can pass through the transparent electrodes and irradiate on the photocuring conductive adhesive to cure the photocuring conductive adhesive, thereby realizing fixedly electrical connection between the qualified LED chips 200 and the substrate 100. Defective LED chips 200 (that is, the bad lights) do not emit light, and the adhesion of the photocuring conductive adhesive corresponding to the abnormal LED chips 200 remains unchanged.

S500: replacing or repairing the LED chips 200 having abnormal light emission, and then enhancing the adhesion of the conductive members 300, thereby completing the fabrication of the LED display panel.

In this embodiment, since the abnormal LED chips 200 do not emit light, the photocuring conductive adhesive corresponding to the abnormal LED chips 200 remains in the liquid state having the low adhesion. Therefore, the LED chips 200 having abnormal light emission can be replaced or repaired directly on the substrate 100, and after replacing or repairing, the adhesion of the conductive members 300 corresponding to the LED chips 200 originally having abnormal light emission can be enhanced for fixation. Finally, high efficiency of LED detection and repair can be realized, thereby effectively improving the efficiency of LED detection and repair.

In the embodiments of the present disclosure, the solder paste used to connect the LED chips 200 to the substrate 100 in the conventional technology is replaced with the conductive members 300 having adjustable adhesion, the conductive members 300 are preferably the photocuring conductive adhesive, and the electrodes of the LED chips 200 are set as transparent electrodes. When the LED chips 200 are detected for bad lights, the visible light emitted by the normal LED chips 200 can pass through the transparent electrodes of the LED chips 200 and irradiate onto the photocuring conductive adhesive, thereby realizing fixedly electrical connection between the qualified LED chips 200 and the substrate 100. The defective LED chips 200 (that is, the bad lights) do not emit light, and the adhesion of the photocuring conductive adhesive corresponding to the abnormal LED chips 200 remains unchanged. Therefore, the LED chips 200 having abnormal light emission can be replaced or repaired directly on the substrate 100, and after replacing or repairing, the adhesion of the conductive members 300 corresponding to the LED chips 200 originally having abnormal light emission can be enhanced for fixation. Finally, high efficiency of LED detection and repair can be realized, thereby effectively improving the efficiency of LED detection and repair.

The LED display panel and the manufacturing method thereof provided by the embodiments of the present disclosure are described in detail above. Specific examples are used herein to explain the principles and implementation of the present disclosure. The descriptions of the above embodiments are only used to help understand the method of the present disclosure and its core ideas; meanwhile, for those skilled in the art, the range of specific implementation and application may be changed according to the ideas of the present disclosure. In summary, the content of the specification should not be construed as causing limitations to the present disclosure.

What is claimed is:

1. A light-emitting diode (LED) display panel, comprising:
    a substrate;
    an LED array comprising a plurality of LED chips disposed on the substrate in an array; and
    a plurality of conductive members disposed between the LED chips and the substrate, wherein the LED chips are fixed onto and electrically connected to the substrate by the conductive members, the conductive members comprise a photocuring conductive adhesive, and the photocuring conductive adhesive is changed from a liquid state to a solid state under a visible light condition;
    wherein the conductive members have adhesion, and the adhesion is adjustable;
    wherein each of the LED chips comprises a light-emitting part and an electrode part electrically connected to the light-emitting part, the electrode part comprises at least one transparent electrode, the substrate is provided with a plurality of positioning grooves disposed in an array; and each of the conductive members is disposed in a corresponding one of the positioning grooves;
    wherein a bottom of the conductive member is adhered and flattened on a bottom of the positioning groove, and a bottom of the transparent electrode is adhered on a top of the conductive member to electrically connect the transparent electrode to the substrate.

2. The LED display panel according to claim 1, further comprising a light-shielding wall disposed between two adjacent LED chips.

3. The LED display panel according to claim 2, wherein a distance from a side surface of the light-shielding wall away from the substrate to the substrate is greater than or equal to a distance from a side surface of the LED chips away from the substrate to the substrate.

4. The LED display panel according to claim 2, wherein in a light-emitting direction of the LED display panel, a depth of the positioning grooves is greater than or equal to a thickness of the conductive members, and the depth of the positioning grooves is less than or equal to a sum of thicknesses of the conductive members and the at least one transparent electrode.

5. The LED display panel according to claim 2, wherein the substrate is provided with a plurality of barrier members disposed in an array, and the barrier members are defined with positioning grooves corresponding to the LED chips; and
    the conductive members are disposed in the positioning grooves, in a light-emitting direction of the LED display panel, a depth of the positioning grooves is greater than or equal to a thickness of the conductive members, and the depth of the positioning grooves is less than or equal to a sum of thicknesses of the conductive members and the at least one transparent electrode.

6. The LED display panel according to claim 1, wherein an orthographic projection of the at least one transparent electrode on the conductive members is located in the conductive members.

7. The LED display panel according to claim 1, wherein the electrode part of each of the LED chips comprises a first transparent electrode and a second transparent electrode insulated from each other, and each of the conductive members comprises a first conductive part electrically connected to the first transparent electrode and a second conductive part electrically connected to the second transparent electrode; and the first conductive part is insulated from the second conductive part.

8. The LED display panel according to claim 7, wherein the first conductive part and the second conductive part are arranged separately, and in a first direction, a spacing between the first conductive part and the second conductive part is less than or equal to a spacing between the first transparent electrode and the second transparent electrode; and the first direction is parallel to a connecting direction of the first transparent electrode and the second transparent electrode.

9. The LED display panel according to claim 7, wherein each of the LED chips further comprises an insulating part disposed between the first transparent electrode and the second transparent electrode; and in a light-emitting direction of the LED display panel, a thickness of the insulating part is equal to a sum of a thickness of the first transparent electrode or the second transparent electrode and a thickness of the conductive members.

* * * * *